(12) United States Patent
Chen et al.

(10) Patent No.: US 9,000,573 B2
(45) Date of Patent: Apr. 7, 2015

(54) PACKAGE ON PACKAGE STRUCTURE AND METHOD FOR MANUFACTURING SAME

(71) Applicants: HongQiSheng Precision Electronics (QinHuangDao) Co.,Ltd., Qinhuangdao (CN); Zhen Ding Technology Co., Ltd., Tayuan, Taoyuan (TW)

(72) Inventors: Chien-Chih Chen, Qinhuangdao (CN); Hong-Xia Shi, Qinhuangdao (CN); Shih-Ping Hsu, Taoyuan (TW)

(73) Assignees: HongQiSheng Precision Electronics (QinHuangDao) Co., Ltd., Qinhuangdao (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 14/477,888

(22) Filed: Sep. 5, 2014

(65) Prior Publication Data
US 2014/0374894 A1 Dec. 25, 2014

Related U.S. Application Data

(62) Division of application No. 13/777,043, filed on Feb. 26, 2013, now Pat. No. 8,853,000.

(30) Foreign Application Priority Data

Aug. 28, 2012 (CN) .......................... 2012 1 0309530

(51) Int. Cl.
H01L 23/02 (2006.01)
H01L 25/10 (2006.01)
H01L 23/00 (2006.01)

(52) U.S. Cl.
CPC .............. H01L 25/105 (2013.01); H01L 24/29 (2013.01); H01L 2225/1058 (2013.01); H01L 2225/107 (2013.01)

(58) Field of Classification Search
USPC ................. 257/678, 686, 698, 699, 733, 734, 257/E23.011, E23.061
See application file for complete search history.

(56) References Cited

U.S. PATENT DOCUMENTS

2012/0112361 A1* 5/2012 Han et al. ...................... 257/774

* cited by examiner

Primary Examiner — Hoai V Pham
(74) Attorney, Agent, or Firm — Novak Druce Connolly Bove + Quigg LLP

(57) ABSTRACT

A package on package structure includes a connection substrate having a main body and electrically conductive posts, the main body includes a first surface and an opposite second surface, and each electrically conductive post passes through the first and second surfaces, and each end of the two ends of the electrically conductive post protrudes from the main body; a first package device arranged on a side of the first surface of the connection substrate; a package adhesive arranged on a side of the second surface of the connection substrate; and a second package device arranged on a side of the package adhesive furthest away from the first package device.

9 Claims, 11 Drawing Sheets

US 9,000,573 B2

PACKAGE ON PACKAGE STRUCTURE AND METHOD FOR MANUFACTURING SAME

CROSS REFERENCE TO RELATED APPLICATION

This is a divisional of application Ser. No. 13/777,043 filed Feb. 26, 1998, now U.S. Pat. No. 8,853,000.

FIELD

The present disclosure generally relates to semiconductor package technology, and particularly to a package on package structure.

BACKGROUND

Among the existing package structures for semiconductors, a package on package structure is one of the well-known package structures.

A typical package on package structure includes an upper package device, a lower package device, and an epoxy molding compound layer sandwiched between the upper package and the lower package device. The epoxy molding compound layer includes a number of receiving holes and a number of electrically conductive posts. Each electrically conductive post is received in a receiving hole for electrically connecting the upper package device and the lower package device. Each electrically conductive post is formed in the receiving hole by filling and solidifying electrically conductive paste.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
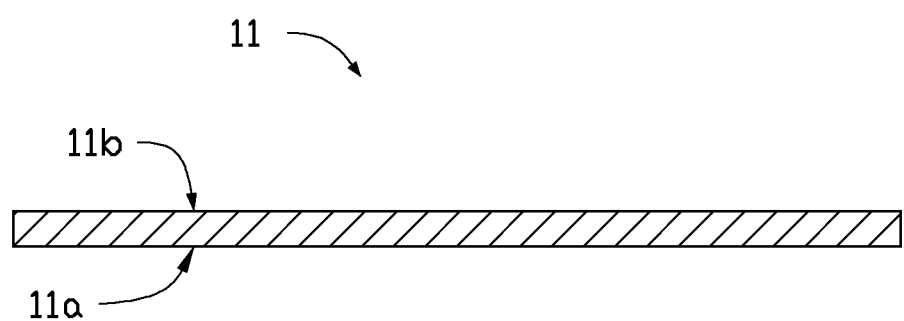
FIG. 1 is a schematic, cross-sectional view of a main body according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

A package on package structure includes a connection substrate, a first package device, a package adhesive and a second package. The connection substrate includes a main body and a plurality of electrically conductive posts attached in the main body. The main body has a first surface and an opposite second surface, and each electrically conductive post passes through the first surface and the second surface, and opposite ends of each electrically conductive post protrudes from the main body. The first package device is attached on the first surface of the connection substrate. The first package device includes a circuit substrate and a semiconductor chip packaged on the circuit substrate. The circuit substrate includes a plurality of first solder pads aligned with the electrically conductive posts, each first solder pad is in contact with and electrically connected to the corresponding one of the electrically conductive posts. The package adhesive is attached on the second surface of the connection substrate. The package adhesive covers the second surface of the connection substrate and the semiconductor chip. An end surface of each electrically conductive post furthest away from the first package device is exposed at the package adhesive. The second package is attached on the end surfaces of the electrically conductive posts furthest away from the first package device. The second package device includes a plurality of solder balls aligned with the electrically conductive posts. Each solder ball is soldered to the end surface of the corresponding electrically conductive post which is exposed at the package adhesive.

A method of manufacturing a package on package structure according to a first embodiment includes the steps as follows.

Figure 2:
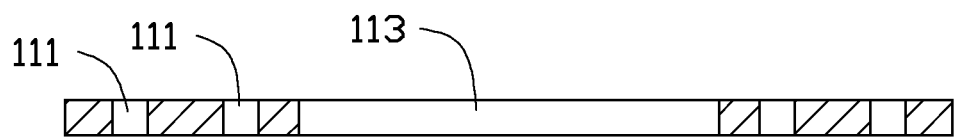
FIG. 2 is similar to FIG. 1, but showing a plurality of first receiving holes and a second receiving hole defined in the main body.
Figure 3:
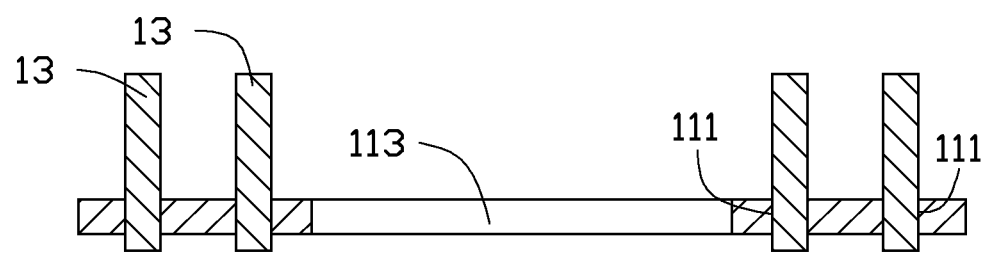
FIG. 3 is similar to FIG. 2, but showing an electrically conductive post formed in a first receiving hole.

FIGS. 1, 2 and 3 show step 1, in which a connection substrate 10 is provided. The connection substrate 10 includes a main body 11 and a plurality of electrically conductive posts 13 arranged in the main body 11. The main body 11 has a first surface 11a and an opposite second surface 11b. A plurality of first receiving holes 111 and a second receiving hole 113 are defined in the main body 11. The second receiving hole 113 and each of the first receiving holes 111 passes through the first surface 11a and the second surface 11b, and the first receiving holes 111 surround the second receiving hole 113. The first receiving holes 111 correspond to the electrically conductive posts 13, such that each electrically conductive post 13 is received in the corresponding first receiving hole 111, and opposite ends of the electrically conductive post 13 protrude out of the main body 11. That is, an end surface of each electrically conductive post 13 nearest the first surface 11a protrudes out of the first surface 11a, and an end surface of each electrically conductive post 13 nearest the second surface 11b protrudes out of the second surface 11b. In the present embodiment, a distance between the end surface of each electrically conductive post 13 nearest the first surface 11a and the first surface 11a is smaller than a distance between the other end surface of the same electrically conductive post 13 and the second surface 11b. Preferably, the distance between the end surface of each electrically conductive post 13 and the first surface 11a is in a range from about one-eighth to one-sixth of the distance between the other end surface of the same electrically conductive post 13 and the second surface 11b. In the present embodiment, the distance between the end surface of each electrically conductive post 13 and the first surface 11a is one-seventh of the distance between the other end surface of the same electrically conductive post 13 and the second surface 11b. The second receiving hole 113 receives a semiconductor chip 22 described as below.

In the present embodiment, the connection substrate 10 may be manufactured by the following steps.

First, the main body 11 shown in FIG. 1 is provided. The main body 11 includes the first surface 11a and the second surface 11b. The main body 11 may be made of polyimide, polyethylene terephtalate, polytetrafluorethylene, polyaminde, polymethyl methacrylate, polycarbonate, polyamide polyethylene-terephthalate copolymer, glass fiber/resin compound, or other materials. In the present embodiment, the main body 11 is made of polyimide.

Second, FIG. 2 illustrates that the second receiving hole 113 and the first receiving holes 111 are defined in the main body 11 by a laser beam or a blanking die.

Then, FIG. 3 illustrates that an electrically conductive post 13 is received in one first receiving hole 111, the connection substrate 10 is obtained by inserting an electrically conductive post 13 (e.g. copper post, silver post, gold post, solder post, etc.) in each first receiving hole 111. In the present embodiment, an electrically conductive post 13 is formed in one first receiving hole 111 by inserting a copper post in each first receiving hole 111.

Figure 4:
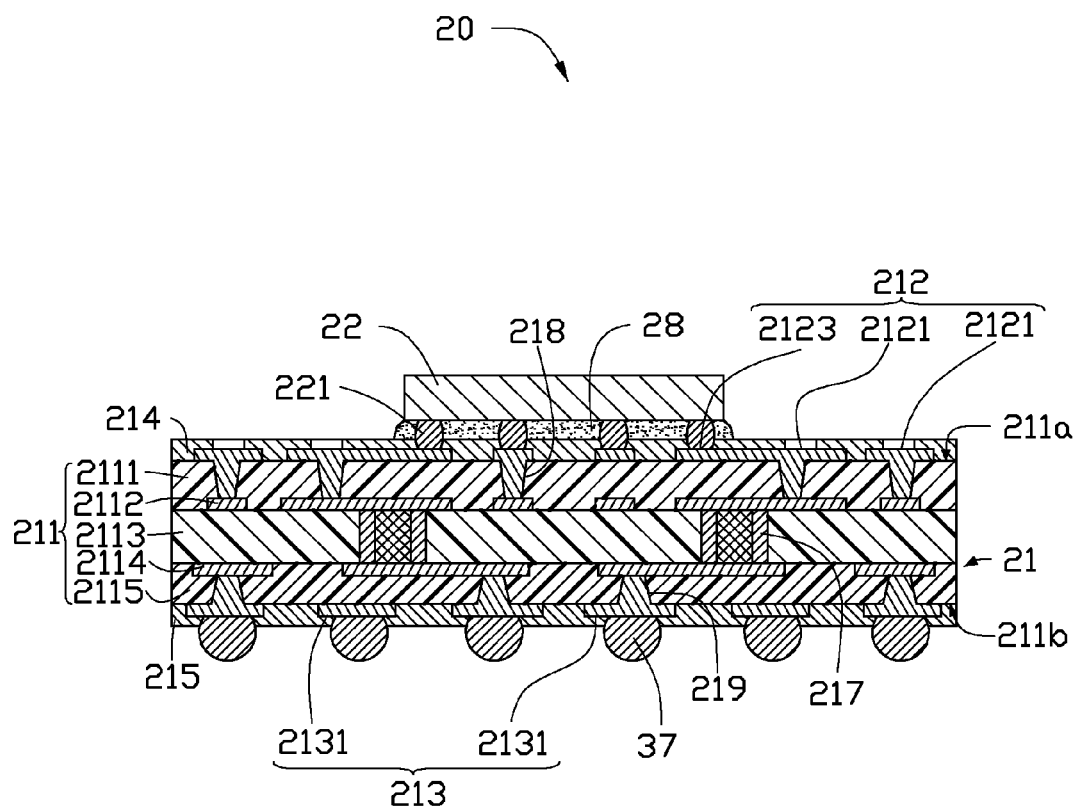
FIG. 4 is a schematic, cross-sectional view of a first package device according to the first embodiment.

FIG. 4 shows that in step 2, a first package device 20 is provided. The first package device 20 includes a circuit substrate 21 and a semiconductor chip 22 packaged on the circuit substrate 21.

The circuit substrate 21 may be a single-sided circuit board, a double-sided circuit board, or a multi-layered circuit board. The circuit substrate 21 includes a circuit base 211, a first electrically conductive pattern 212, a second electrically conductive pattern 213, a first solder mask 214, and a second solder mask 215. In the present embodiment, the circuit substrate 21 is a four-layer circuit board, and there are two electrically conductive pattern layers in the circuit substrate 21.

The circuit base 211 includes a first insulation layer 2111, a first electrically conductive pattern layer 2112, a second insulation layer 2113, a second electrically conductive pattern layer 2114, and a third insulation layer 2115. The first electrically conductive pattern layer 2112 and the second electrically conductive pattern layer 2114 are formed on the opposite surfaces of the second insulation layer 2113, respectively. The first electrically conductive pattern layer 2112 is electrically connected to the second electrically conductive pattern layer 2114 by at least one buried hole 217. The first insulation layer 2111 covers the first electrically conductive pattern layer 2112. A surface of the first insulation layer 2111 furthest away from the second insulation layer 2113 is considered as the upper surface 211a of the circuit base 211. The third insulation layer 2115 covers the second electrically conductive pattern layer 2114. A surface of the third insulation layer 2115 furthest away from the second electrically conductive pattern layer 2114 is considered as the lower surface 211b of the circuit base 211.

The first electrically conductive pattern 212 is formed on the upper surface 211a of the circuit substrate 211, and is electrically connected to the first electrically conductive pattern layer 2112 by at least one blind hole 218. The first electrically conductive pattern 212 includes a plurality of first solder pads 2121, a plurality of second solder pads 2123, and a plurality of electrically conductive traces (not shown). Each of second solder pads 2123 is attached between the first solder pads 2121. That is, the first solder pads 2121 surround the second solder pads 2123. The first solder pads 2121 spatially correspond to the electrically conductive posts 13, such that the electrically conductive posts 13 electrically connect the circuit substrate 21 with a second package device 50 described below. The second solder pads 2123 are electrically connected to the semiconductor chip 22. The semiconductor chip 22 is packaged on the circuit substrate 21 using a wire bonding process, a surface mounted process, or a flip chip process. In the present embodiment, the semiconductor chip 22 is packaged on the circuit substrate 21 using a flip chip process, and the semiconductor chip 22 is electrically connected to the second solder pads 2123 by a plurality of solder bumps 221. The first solder mask 214 covers at least part of the electrically conductive traces of the first electrically conductive pattern 212 and the upper surface 211a which are exposed from the first electrically conductive pattern 212, and exposes the first solder pads 2121 and the second solder pads 2123.

The second electrically conductive pattern 213 is formed on the lower surface 211b of the circuit substrate 211, and is electrically connected to the second electrically conductive pattern layer 2114 by at least one blind hole 219. The second electrically conductive pattern 213 includes a plurality of third solder pads 2131. The third solder pads 2131 are exposed by the second solder mask 215. A plurality of solder balls 37 are formed on the exposed solder pads 2131. The solder balls 37 are configured for electrically connecting the circuit substrate 21 to another circuit board or other electronic elements.

The semiconductor chip 22 may be a memory chip, a logic chip, or a digital chip. In the present embodiment, the semiconductor chip 22 is a logic chip. The semiconductor chip 22 adheres to the surface of the first solder mask 214 using an insulation adhesive layer 28, and is electrically connected to the second solder pads 2123 using a wire bonding process, a surface mounted process, or a flip chip process. In the present embodiment, the semiconductor chip 22 is packaged on the circuit substrate 21 using a flip chip process. The semiconductor chip 22 is electrically connected to the second solder pads 2123 by solder bumps 221.

In other embodiments, the first package device 20 may have another structure, for example, the first package device 20 may further include a newly added semiconductor chip packaged on the semiconductor chip 22, and in such case, the first electrically conductive pattern 212 will further include a plurality of solder pads for electrically connecting the newly added semiconductor chip to the circuit substrate 21. For another example, the circuit substrate 21 may be a multilayered circuit board, and the semiconductor chip 22 may be embedded in the circuit substrate 21 and in such case, the second solder pads 2123 and the second receiving hole 113 may be omitted.

Figure 5:
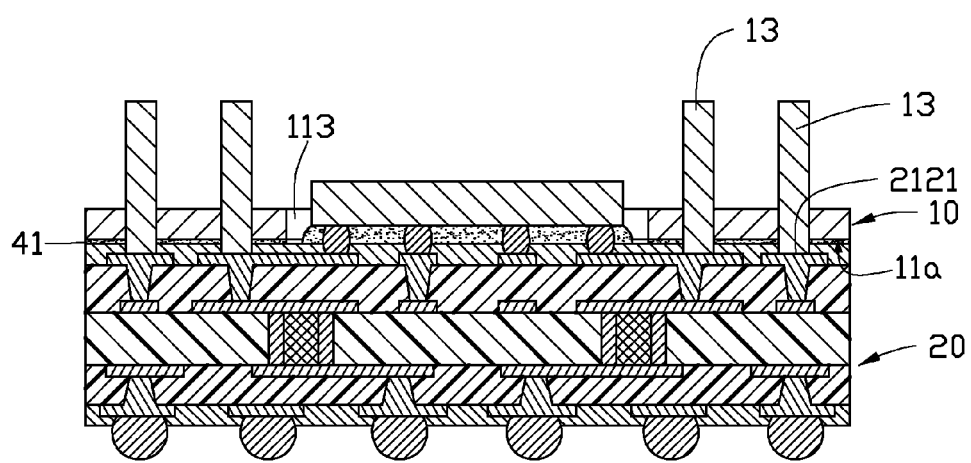
FIG. 5 is similar to FIG. 3, but showing the first package device of FIG. 4 attached on one side of the connection substrate.
Figure 6:
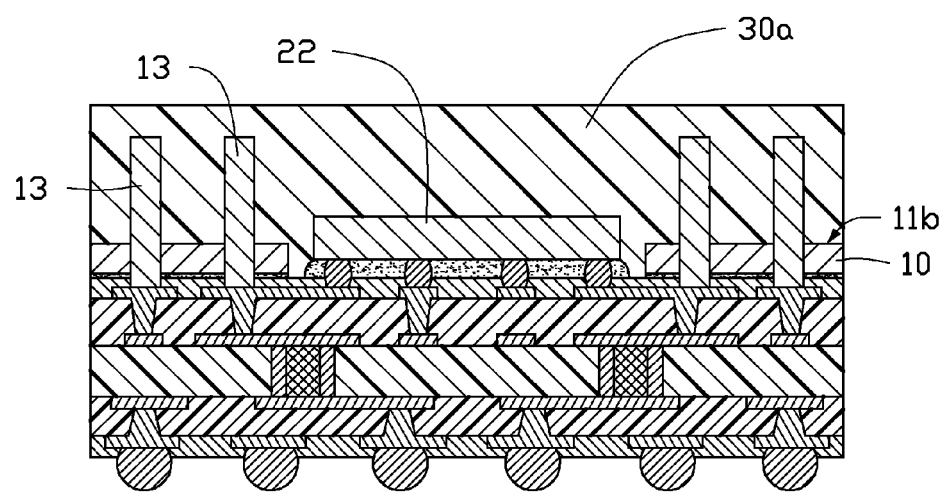
FIG. 6 is similar to FIG. 5, but showing an epoxy molding compound layer attached on the other side of the connection substrate.
Figure 7:
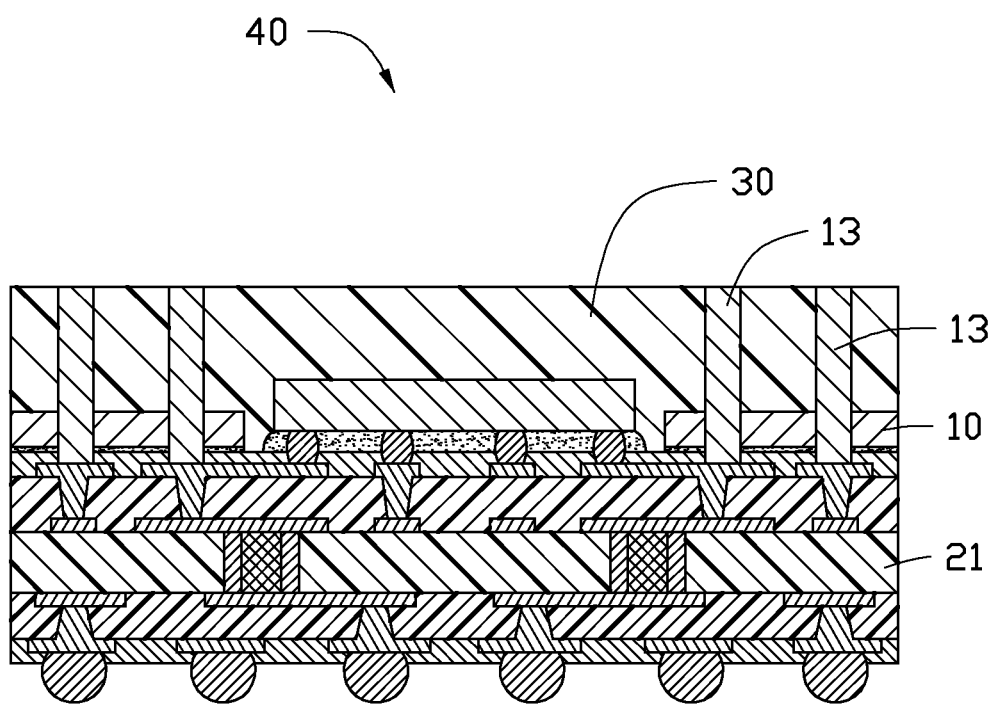
FIG. 7 is similar to FIG. 6, but showing the epoxy molding compound layer after grinding to obtain a semi-finished package on package structure.

FIGS. 5, 6 and 7 illustrate step 3, where the first package device 20 is attached on the first surface 11a of the connection substrate 10, and a package adhesive 30 is attached on the second surface 11b of the connection substrate 10, thereby obtaining a semi-finished package on package structure 40. In the semi-finished package on package structure 40, the semiconductor chip 22 is received in the second receiving hole 113; the first solder pads 2121 spatially correspond to the electrically conductive posts 13, the first solder pads 2121 are aligned with the corresponding electrically conductive posts 13, and the end of each electrically conductive post 13 which is nearest the circuit substrate 21 is in contact with and electrically connected to the corresponding first solder pad 2121; the package adhesive 30 covers the second surface 11b of the connection substrate 10 and the semiconductor chip 22, and one end surface of each electrically conductive post 13 furthest away from the first package device 20 is exposed from at a surface of the package adhesive 30 furthest away from the connection substrate 10. In the embodiment, the end surface of each electrically conductive post 13 which is furthest away from the first package device 20 is coplanar with the surface of the package adhesive 30 furthest away from the connection substrate 10.

In detail, the semi-finished package on package structure 40 may be manufactured as follows.

First, FIG. 5 illustrates that the first package device 20 adheres to the first surface 11a of the connection substrate 10, such that the first solder pads 2121 spatially correspond to the electrically conductive posts 13, and each first solder pad 2121 is in contact with and electrically connected to the corresponding electrically conductive post 13, the semiconductor chip 22 is received in the second receiving hole 113. The connection substrate 10 is adhered to the circuit substrate 21 of the first package device 20 using a first insulation adhesive layer 41.

In other embodiments, the semiconductor chip 22 may be packaged on the circuit substrate 21 after the circuit substrate 21 has been adhesively attached to the connection substrate 10. In detail, the package method for packaging the semiconductor chip 22 on the circuit substrate 21 includes the following steps: first, adhesively attaching the circuit substrate 21 of the first package device 20 to the first surface 11a of the connection substrate 10, such that the first solder pads 2121 are aligned with the respective electrically conductive posts 13, each first solder pad 2121 is in contact with and electrically connected to the corresponding electrically conductive post 13, and the second solder pads 2123 are exposed from the second receiving hole 13; then, packaging the semiconductor chip 22 on the exposed second solder pads 2122 using a wire bonding process, a surface mounted process, or a flip chip process.

Second, FIG. 6 illustrates that an epoxy molding compound layer 30a is formed on the side of the second surface 11b of the connection substrate 10 using a molding process. The epoxy molding compound layer 30a covers the second surface 11b, the electrically conductive posts 13, and the semiconductor chip 22. The epoxy molding compound layer 30a is made of epoxy compound.

Finally, FIGS. 6 and 7 illustrate that the epoxy molding compound layer 30a is ground using a grinding process, such that the distal end of each electrically conductive post 13 is exposed, and is coplanar with a surface of the ground epoxy molding compound layer 30a, thereby forming the semi-finished package on package structure 40 having the package adhesive 30, wherein the ground epoxy molding compound layer 30a is considered as the package adhesive 30. In the embodiment, an area of a cross-section of the package adhesive 30 taken in a plane parallel with the first surface 11a of the connection substrate 10 is equal to the area of the first surface 11a of the connection substrate 10.

Figure 8:
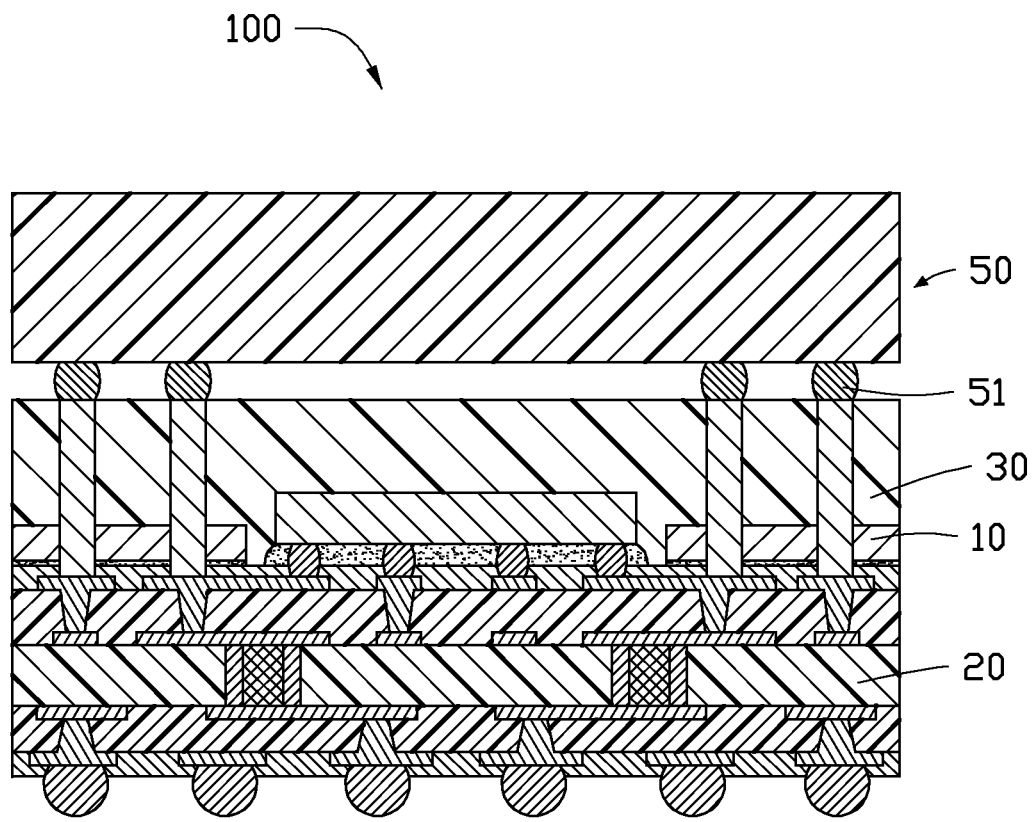
FIG. 8 is similar to FIG. 7, but showing a second package device attached on the semi-finished package on package structure to obtain a package on package structure.
Figure 9:
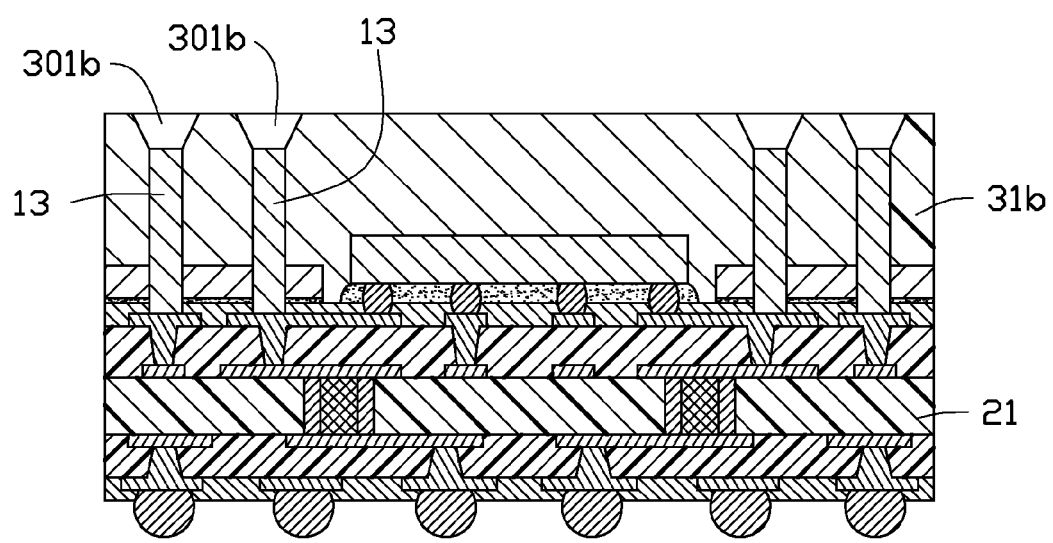
FIG. 9 is similar to FIG. 6, but showing a plurality of blind holes defined in the epoxy molding compound layer according to a second embodiment.

FIG. 8 illustrates that in step 4, a second package device 50 is attached on a side of the package adhesive 30 furthest away from the first package device 50, thereby obtaining a package on package structure 100. The second package device 50 includes a semiconductor chip (not shown). The second package device 50 includes a plurality of solder balls 51. The solder balls 51 spatially correspond to the electrically conductive posts 13, the solder balls 51 are aligned with the respective electrically conductive posts, and each solder ball 51 is soldered to the end surface of the corresponding electrically conductive post 13 exposed at the package adhesive 30. In detail, a method for arranging the second package device 50 on the side of the package adhesive 30 furthest away from the first package device 50 includes the steps as follows. First, the second package device 50 is positioned at the side of the package adhesive 30 furthest away from the first package device 50, such that the solder balls 51 spatially correspond to the electrically conductive posts 13, and each solder ball 51 is in contact with the end surface of an electrically conductive post 13 exposed from the package adhesive 30, thereby forming a stacked structure. Then, the solder balls 51 of the stacked structure are melted, and then solidified, thereby soldering the ends of electrically conductive posts 13 which are close to the second package device 50 to the second package device 50 by the solder balls 51. Accordingly, the package on package structure 100 is obtained.

The package on package structure 100 includes the connection substrate 10, the first package device 20 attached on the side of the first surface 11a of the connection substrate 10, the package adhesive 30 attached on the side of the second surface 11b of the connection substrate 10, and the second package device 50 attached the side of the package adhesive 30 furthest away from the connection substrate 10. The connection substrate 10 includes a plurality of electrically conductive posts 13. The first package device 20 includes the circuit substrate 21 and the semiconductor chip 22 packaged on the circuit substrate 21. The circuit substrate 21 includes the first solder pads 2121 and the second solder pads 2123. The first solder pads 2121 and the second solder pads 2123 are exposed at the same side of the circuit substrate 21, and the first solder pads 2121 surround the second solder pads 2123. The first solder pads 2121 spatially correspond to the electrically conductive posts 13. Each first solder pad 2121 is in contact with and electrically connected to the end of an electrically conductive post 13. The second solder pads 2123 are electrically connected to the semiconductor chip 22. The semiconductor chip 22 is received in the second receiving hole 113. The package adhesive 30 covers the second surface 11b of the connection substrate 10 and the semiconductor chip 22. The end surface of each electrically conductive post 13 furthest away from the first package device 20 is exposed from the surface of the package adhesive 30 furthest away from the connection substrate 10. In the embodiment, the end surface of each electrically conductive post 13 furthest away from the first package device 20 is coplanar with the surface of the package adhesive 30 furthest away from the connection substrate 10. The second package device 50 is packaged on end surfaces of the electrically conductive posts 13 furthest away from the first package device 20.

In the package on package structure 100, the first package device 20 is electrically connected to the second package device 50 by the electrically conductive posts 13 in the connection substrate 10; the electrically conductive posts 13 are inserted into the package adhesive 30, and exposed from the package adhesive 30 covering the connection substrate 10. Therefore, there is no need to fill a liquid or molten conductive material into the receiving holes and solidify the conductive material to form a plurality of electrically connection bodies for electrically connecting the first package device 20 to the second package device 50. Accordingly, the probability of generating bubbles in the connection bodies is lowered, and the rate of finished product of the package on package structure 100 is improved. In addition, the method for manufacturing the package on package structure 100 is very simple, and the cost of the method is much lower.

A method for manufacturing a package on package structure according to a second embodiment includes the following steps.

FIG. 3 illustrates in step 1, the connection substrate 10 of the first embodiment is provided.

FIGS. 4, 5 and 6 illustrate in step 2, the first package device 20 of the first embodiment is attached on a side of the first surface 11a of the connection substrate 10, and a package adhesive layer 30a is attached on a side of the second surface 11b of the connection substrate 10. The package adhesive layer 30a is considered as the adhesive main body 31b in the second embodiment. The adhesive main body 31b covers the second surface 11b of the connection substrate 10, the electrically conductive posts 13 and the semiconductor chip 22.

FIGS. 6 to 9 illustrate that a plurality of blind holes 301b is defined in the package adhesive layer 30a (i.e. the adhesive main body 31b). The blind holes 301b spatially correspond to the electrically conductive posts 13, such that the end surface of each electrically conductive post 13 furthest away from the circuit substrate 21 is exposed from the corresponding blind hole 31b. In the present embodiment, a shape of a cross-section of the blind hole 301b taken in a plane perpendicular to the surface of the adhesive main body 31b furthest away from the circuit substrate 21 is trapezoidal. That is, the blind hold 301b may be a truncated cone-shaped blind hole. The upper line of the trapezoid shape is furthest away from the circuit substrate 21, and the lower line of the trapezoid is nearest the circuit substrate 21. The length of the upper line is greater than the length of the lower line. Each electrically conductive post 13 is a cylindrical body. Each electrically conductive post 13 is coaxial with the corresponding blind hole 301b, and the length of the lower line is equal to the diameter of the electrically conductive post 13. In alternative embodiments, the length of the lower line may be larger than the diameter of the electrically conductive post 13, such that there is an better electrical connection between an electrically conductive block 33b (described below) received in the blind hole 301b and an electrically conductive post 13. In further alternative embodiments, the shape of a cross-sectional area of the blind hole 301b on a surface perpendicular to the surface of the package adhesive 30b furthest away from the circuit substrate 21 may be rectangular. That is, the blind hole 301b may cylindrical, triangular, or quadrangular etc.

Figure 10:
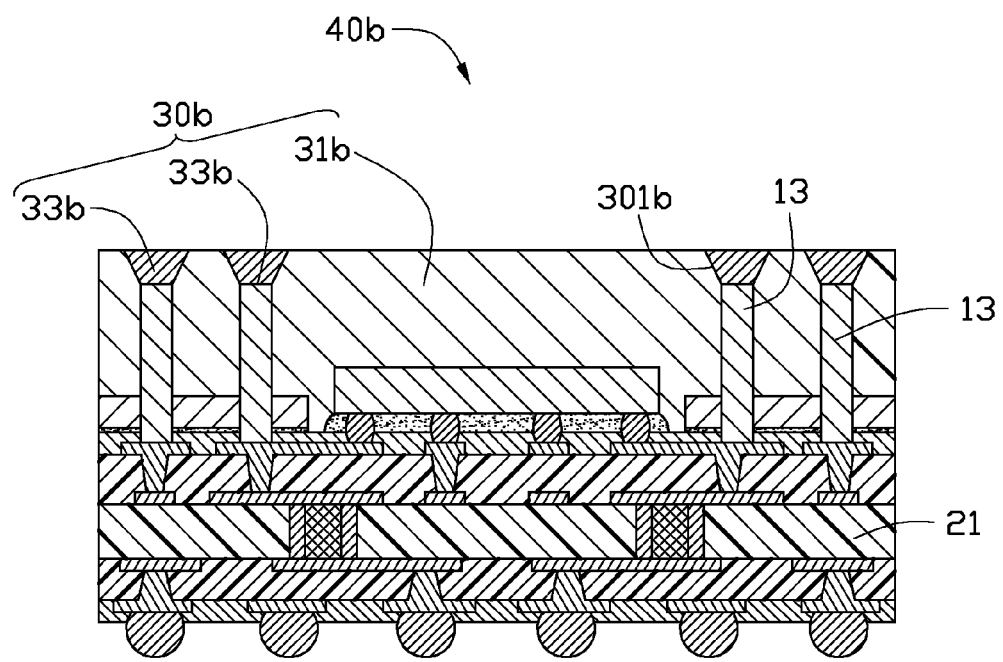
FIG. 10 is similar to FIG. 9, but showing an electrically conductive block formed in a blind hole to obtain a semi-finished package on package structure.

FIG. 10 illustrates in step 4, an electrically conductive block 33b is formed in each blind hole 301b by infilling electrically conductive paste into each blind hole 301b and solidifying the electrically conductive paste, thereby obtaining a semi-finished package on package structure 40b. The electrically conductive blocks 33b and the adhesive main body 31b cooperatively form a package adhesive 30b of the second embodiment. Each electrically conductive block 33b is in contact with and electrically connected to the end surface of an electrically conductive post 13 furthest away from the circuit substrate 21, and each electrically conductive block 33b is exposed from the surface of the adhesive main body 31b furthest away from the circuit substrate 21. In the embodiment, the end surface of each electrically conductive block 33b furthest away from the electrically conductive post 13 is coplanar with the surface of the adhesive main body 31b furthest away from the circuit substrate 21.

Figure 11:
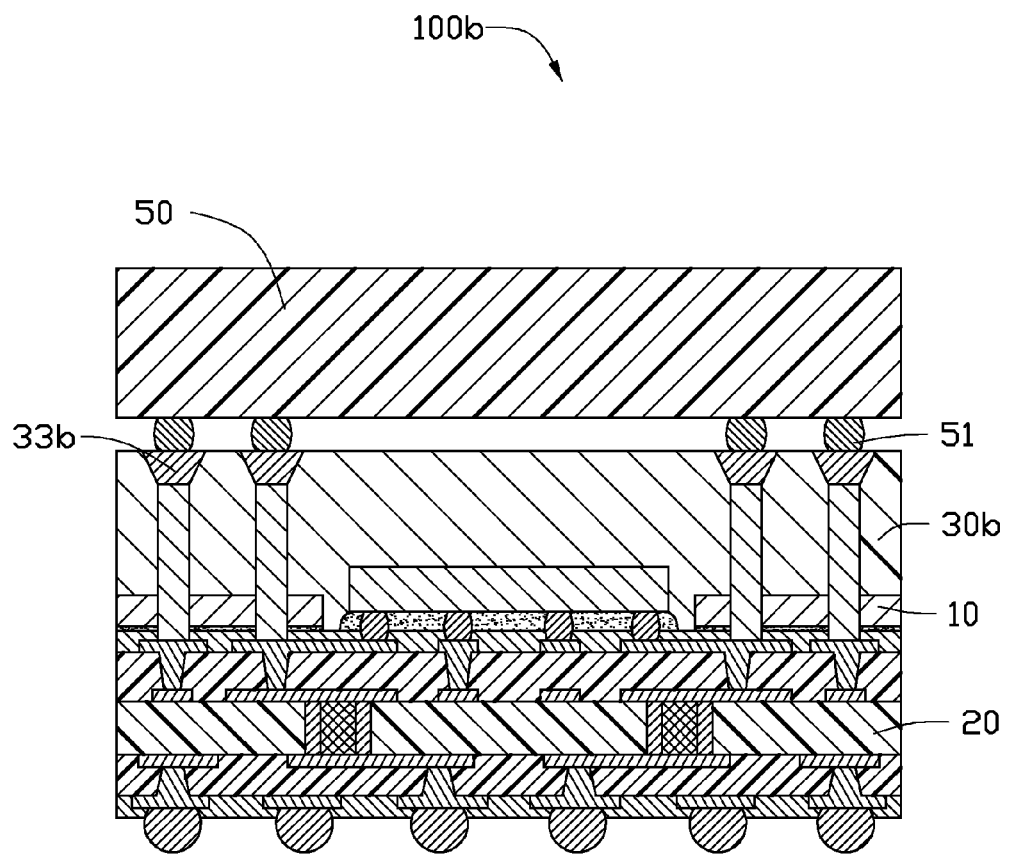
FIG. 11 is similar to FIG. 10, but showing a second package device attached on the semi-finished package on package to obtain a package on package structure.

FIG. 11 illustrates in step 5, where the second package device 50 of the first embodiment is attached on the side of the package adhesive 30b which is furthest away from the first package device, thereby obtaining a package on package structure 100b. The solder balls 51 of the second package device 50 spatially correspond to the electrically conductive blocks 33b, and each solder ball 51 is soldered to an end surface of an electrically conductive block 33b which is exposed from the adhesive main body 31b. In detail, a method for arranging the second package device 50 on the side of the package adhesive 30b furthest away from the first package device 50 includes the steps as follows. First, the second package device 50 is positioned at the side of the package adhesive 30b furthest away from the first package device 50, such that the solder balls 51 spatially correspond to the electrically conductive blocks 33b, and each solder ball 51 is in contact with the end surface of an electrically conductive block 33b exposed from the adhesive main body 31b, thereby forming a stacked structure. Then, the solder balls 51 of the stacked structure are melted, and are solidified, thereby soldering the ends of electrically conductive blocks 33b closest to the second package device 50 to the second package device 50, by the solder balls 51. Accordingly, the package on package structure 100b is obtained.

The package on package structure 100b includes the connection substrate 10, the first package device 20 attached on the side of the first surface 11a of the connection substrate 10, the package adhesive 30b attached on the side of the second surface 11b of the connection substrate 10, and the second package device 50 attached the side of the package adhesive 30b furthest away from the connection substrate 10. The connection substrate 10 includes a plurality of electrically conductive posts 13. The first package device 20 includes the circuit substrate 21 and the semiconductor chip 22 packaged on the circuit substrate 21. The circuit substrate 21 includes the first solder pads 2121 and the second solder pads 2123. The first solder pads 2121 and the second solder pads 2123 are exposed at the same side of the circuit substrate 21, and the first solder pads 2121 surround the second solder pads 2123. The first solder pads 2121 spatially correspond to the electrically conductive posts 13. Each first solder pad 2121 is in contact with and electrically connected to the end of an electrically conductive post 13. The second solder pads 2123 are electrically connected to the semiconductor chip 22. The semiconductor chip 22 is received in the second receiving hole 113. The package adhesive 30b covers the second surface 11b of the connection substrate 10, the electrically connective posts 13, and the semiconductor chip 22. The package adhesive 30b includes the adhesive main body 31b and the electrically conductive blocks 33b in the adhesive main body 31b. The blind holes 301b are defined in the adhesive main body 31b, and spatially correspond to the electrically conductive blocks 33b, such that one electrically conductive block 33b is received in a blind hole 301b. The blind holes 301b spatially correspond to the electrically conductive posts 13, such that the end surface of each electrically conductive post 13 furthest away from the circuit substrate 21 is exposed from a blind hole 301, and the end surface of each electrically conductive post 13 furthest away from the circuit substrate 21 is in contact with and electrically connected to an electrically conductive block 33b. The end surface of each electrically conductive block 33b furthest away from the first package device 20 is exposed from the surface of the adhesive main body 31b furthest away from the connection substrate 10. In the embodiment, the end surface of each electrically conductive block 33b furthest away from the first package device 20 is coplanar with the surface of the adhesive main body 31b furthest away from the connection substrate 10. The second package device 50 is packaged on the end surfaces of the electrically conductive blocks 13 furthest away from the first package device 20.

In the package on package structure 100b, the first package device 20 is electrically connected to the second package device 50 by the electrically conductive posts 13 in the connection substrate 10 and the electrically conductive blocks 33b in the package adhesive 30b. The electrically conductive posts 13 are inserted into the package adhesive 30b, thereby reducing the thickness of each electrically conductive block 33b. Therefore, there is no need to fill a liquid or molten conductive material into the receiving holes in the package adhesive 30b to form a plurality of electrically connection blocks having greater thickness than the electrically conductive block 33b. Accordingly, the probability of generating bubbles in the electrically conductive block is lowered in the package adhesive 30b, and the rate of finished product of the package on package structure 100b is higher. In addition, the method for manufacturing the package on package structure 100b is very simple, and the cost of the method is much lower.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A package on package structure, comprising:
    a connection substrate, the connection substrate comprising a main body and a plurality of electrically conductive posts attached to the main body, the main body having a first surface and an opposite second surface, each electrically conductive post passing through the first surface and the second surface, and opposite ends of each electrically conductive post protruding out of the main body;
    a first package device attached on the first surface of the connection substrate, the first package device comprising a circuit substrate and a semiconductor chip packaged on the circuit substrate, the circuit substrate comprising a plurality of first solder pads aligned with the electrically conductive posts, and each first solder pad being in contact with and electrically connected to a corresponding one of the electrically conductive posts;
    a package adhesive attached on the second surface of the connection substrate, the package adhesive covering the second surface of the connection substrate and the semiconductor chip, and an end surface of each electrically conductive post furthest away from the first package device being exposed at the package adhesive; and
    a second package attached on the end surfaces of the electrically conductive posts furthest away from the first package device, the second package device comprising a plurality of solder balls, the solder balls aligned with the electrically conductive posts, and each solder ball being soldered to the end surface of the corresponding electrically conductive post which is exposed at the package adhesive.

2. The package on package structure of claim 1, wherein the connection substrate is adhered to the circuit substrate of the first package device using a first insulation adhesive layer.

3. The package on package structure of claim 1, wherein a distance between the end surface of each electrically conductive post nearest the first surface and the first surface is smaller than a distance the other end surface of the same electrically conductive post and the second surface.

4. The package on package structure of claim 1, wherein an area of a cross-section of the package adhesive taken in a plane parallel with the first surface of the connection substrate is equal to the area of the first surface of the connection substrate.

5. The package on package structure of claim 1, wherein the connection substrate further comprises a second receiving hole, the second receiving hole is surrounded by the electrically conductive posts, the semiconductor chip is received in the second receiving hole.

6. The package on package structure of claim 1, wherein the circuit substrate further comprises a plurality of second solder pads, the second solder pads and the first solder pads are arranged at the same side of the circuit substrate, and the first solder pads surround the second solder pads, the second solder pads are electrically connected to the semiconductor chip.

7. The package on package structure of claim 1, wherein the end surface of each electrically conductive post which is furthest away from the first package device is coplanar with the surface of the package adhesive furthest away from the connection substrate.

8. The package on package structure of claim 1, wherein the package adhesive defines a plurality of blind holes spatially corresponded to the electrically conductive posts, the end surface of each electrically conductive post furthest away from the circuit substrate is exposed from a blind hole, a plurality of electrically conductive blocks are respectively received in the blind holes, the end surface of each electrically conductive post furthest away from the circuit substrate is in contact with and electrically connected to an electrically conductive block, the end surface of each electrically conductive block furthest away from the first package device is exposed from the surface of the adhesive main body furthest away from the connection substrate, the second package device is packaged on the end surfaces of the electrically conductive blocks furthest away from the first package device.

9. The package on package structure of claim 1, wherein the end surface of each electrically conductive block furthest away from the first package device is coplanar with the surface of the adhesive main body furthest away from the connection substrate.

* * * * *